Sept. 1, 1970 C. G. KEPPLE ET AL 3,526,568

FLEXIBLE FOIL CLAD LAMINATES

Filed June 11, 1969

3,526,568
FLEXIBLE FOIL CLAD LAMINATES

Charles G. Kepple, Bedford, and Norman E. Martello, Turtle Creek, Pa., assignors to Westinghouse Electric Corporation, Pittsburgh, Pa., a corporation of Pennsylvania Continuation-in-part of application Ser. No. 533,002, Mar. 9, 1966, now Patent No. 3,473,992. This application June 11, 1969, Ser. No. 832,098
Int. Cl. B32b 7/00; C09j 5/04
U.S. Cl. 161—165 5 Claims

ABSTRACT OF THE DISCLOSURE

A substrate of flexible fibrous material having at least one smooth coating of an insulating synthetic resin permeating the material. On at least one side thereof, a resinous adhesive is provided on the surface of the resin-coated substrate, the coating and/or adhesive is derived from a saturated polyhydric alcohol and a metal foil which can be processed to form a circuit is attached to the adhesive.

CROSS-REFERENCE TO RELATED APPLICATIONS

This application is a continuation-in-part of pending application Ser. No. 533,002, filed Mar. 9, 1966, and now U.S. Pat. 3,473,992; and is closely related to the invention disclosed in application Ser. No. 832,097, filed June 11, 1969.

BACKGROUND OF THE INVENTION

Field of the invention

This invention relates to flexible foil-clad laminates suitable for use on printed electrical circuits or components and more particularly it pertains to the manufacture of extremely thin flexible foil-clad laminated members and printed circuits prepared therefrom.

Description of the prior art

One contribution to the micro-electronic industry has been the so-called "printed" circuit in which some or all of the components of an electrical circuit are mounted on an insulated base by adaption of conventional printing methods. Some advantages of that type of circuit are compactness, lightweight, duplication, and economy.

Most insulating bases or carrier webs are composed of a plurality of superimposed layers of a sheet-like material such as fiberglass or woven cotton cloth that are impregnated and coated with an electrically insulating thermosetting resin. An electrically conducting patterned foil of metal is bonded to the base by an adhesive. Most of such composites, however, have disadvantages including poor dimensional stability during processing, poor cold flow characteristics, and separation of the base and metal pattern. Moreover, a base composed of resin impregnated fiberglass loses its flexibility with age. That is particularly true where the base is flexed repeatedly.

The flexible foil-clad laminates suitable for use on printed electrical circuits of this invention are to be distinguished from molded laminates of rigid structure. U.S. Pat. No. 2,779,700 discloses a flame retardant polyester resinous composition containing halogen for use in making molded laminates which are rigid. For that purpose an unsaturated polyester is used because it is sufficiently reactive to dry and stiffen. For rigid molded laminates the unsaturated polyester is satisfactory, but for flexible printed circuits and components a coating should be used that contains semi-drying oils that never becomes completely stiff.

Similarly, U.S. Pat. No. 3,189,513 discloses a self-extinguishing glass-polyester laminate containing a halogen and a monomeric material such as a chlorinated polyester resin. Like the product of Pat. No. 2,779,700 the products of Pat. No. 3,189,513 are rigid molded laminates consisting of at least two sheets of glass fabric. For that purpose the monomeric compounds are satisfactory and acts as a plasticizer that bleeds out and later becomes stiff and poorly insulating. Here again a cholinated polyester resin is not satisfactory for printed circuits where permanent flexibility is required.

It is to be noted that the articles of Pat. Nos. 2,779,700 and 3,189,513 are rigid or molded laminates having resins including major portions of monomers and/or unsaturated polyesters that have reactive cites and ultimately become stiff and poor insulators.

U.S. Pat. No. 3,301,730 discloses a printed circuit of metal foil bonded onto a rigid or molded laminate. The bonding adhesive for the metal foil is an uncured resin which is suitable where the laminate is rigid or unflexible. Where, however, the laminate is flexible, a disadvantage occurs that is not involved with rigid laminates. The uncured resinous adhesive is not satisfactory to permanently bond the metal foil to its substrate. Repeated flexing during use usually causes the metal foil (particularly copper foil) to separate from the substrate. For that reason a cured resinous adhesive should be used to bond a metal foil to a flexible laminate, which is not disclosed by Pat. No. 3,301,730.

SUMMARY OF THE INVENTION

It has been found that the foregoing problems may be overcome by providing a laminated composite of one or more layers of circuits composed of a base of a single flexible sheet-like fibrous material having at least one coating of an insulating synthetic resin permeating the material and, on at least one side thereof, a resinous adhesive on the surface of the resin coated base, at least one of the coating and adhesive containing a saturated polyhydric alcohol, and a metal foil to form a circuit attached to the adhesive. In some cases the patterned metal foil may be embedded in the adhesive. The resins comprising the coating and adhesive contain major portions of saturated polyesters such as saturated polyhydric alcohol (with minimal amounts, if any, of unsaturated polyesters or monomers) which do not react sufficiently to become rigid and inflexible to bending.

Accordingly, it is an object of the present invention to provide a flexible printed circuit composition having one or more printed circuits adhesively bonded to a single sheet of a flexible fibrous base material.

It is another object of this invention to provide a flexible printed circuit composition having a single sheet of fibrous base impregnated and covered with a fully-cured synthetic resin insulating material.

It is another object of this invention to provide a flexible printed surface composite which does not deform when subjected to heat, which has satisfactory cold-flow characteristics, and which has excellent dimensional stability.

It is another object of this invention to provide a method for making flexible printed circuit composites including the complete impregnation of a sheet-like fibrous flexible web with a synthetic resin and thereafter fully curing the resin to a thermoset state.

Finally, it is an object of this invention to satisfy the foregoing objects and desiderata in an expedient manner.

Briefly, the present invention consists essentially of a base of flexible fibrous material having at least one smooth surface coating of an insulating thermoset synthetic resin permeating the interstices of and impregnating the fibrous material, the synthetic resinous coatings being fully cured, and, on at least one side thereof, a resinous adhesive on the surface of the fully cured resin coated base, at least one of the coating and adhesive containing a saturated polyhydric alcohol and at least one layer of a metallic foil printed circuit bonded to the adhesive and having the circuit embedded therein.

Generally, the material of the invention may be made by producing a flexible metal foil clad member including the steps of applying a plurality of coatings of a thermosettable synthetic resin to a single sheet of flexible fibrous material, at least partly curing the resin, applying a resinous adhesive coating to at least one surface of the cured resin, heat treating the adhesive coating to a tack-free state short of complete curing, applying to a metal foil a coating of a resinous adhesive solution and also heat treating the adhesive, and pressing the adhesive coated fibrous sheet material and the adhesive coated foil together while heating the composite of the member and the foil to completely cure the resin and adhesive and to bond the metal foil to the flexible sheet.

BRIEF DESCRIPTION OF THE DRAWINGS

For a better understanding of the nature and objects of this invention reference is made to the drawings, in which.

DESCRIPTION OF THE PREFERRED EMBODIMENT

Figures 1, 2, 3, 4, 5:
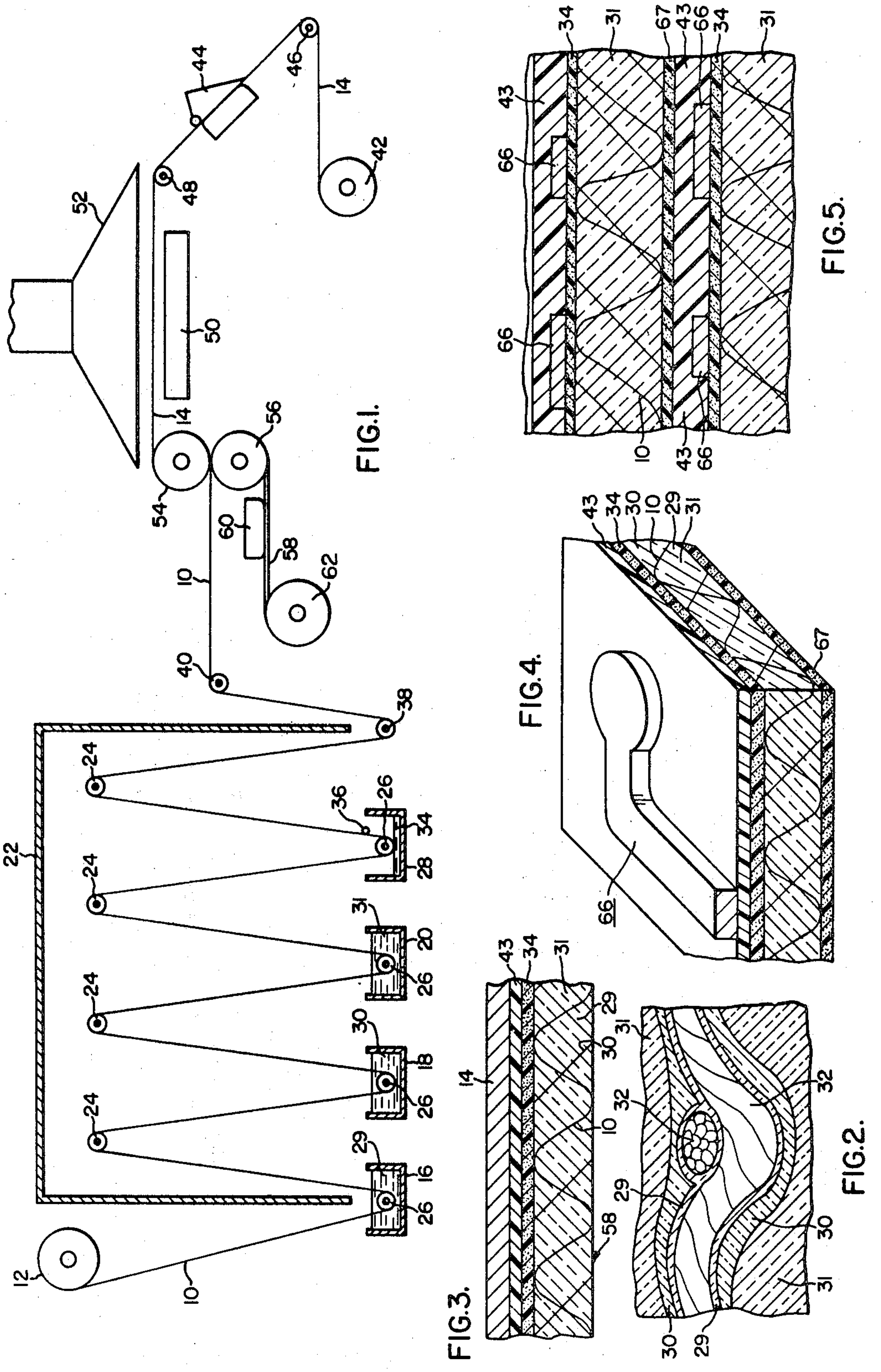
FIG. 1 is a diagrammatic view of a process.
FIG. 2 is an enlarged sectional view showing the manner in which successive resinous coatings adhere to glass fiber strands.
FIG. 3 is an enlarged sectional view showing adjacent layers of metal foil, resinous adhesive, and a fibrous insulating base material.
FIG. 4 is an enlarged perspective view of a fragmentary portion showing a portion of a printed circuit member after the surrounding metal foil has been etched away, and showing an addition bonding resin layer on the underside of the fibrous base material.
FIG. 5 is a fragmentary vertical sectional view through a plurality of layers of printed circuits after they have been pressed together into one compact unit.

As shown in FIG. 1 a strip 10 of a fibrous carrier web or substrate of backing material is discharged from a coil 12 and is subjected to a number of coatings of insulating material before it is united with a strip 14 of metallic foil, preferably copper. The strip 10 is a flexible sheet-like member which is composed of a fibrous material such as woven glass fibers, Dacron mat, non-woven glass mat, asbestos cloth, cotton cloth, and paper. The strip 10 is preferably provided with at least one coating of resinous material such as shown in containers or tanks 16, 18 and 20 which are disposed at the lower side of a drying tower 22 at the upper end of which are the disposed spaced rollers 24. Similar rollers 26 are provided in each tank 16, 18, and 20 for guiding the strip into the tank. An additional tank 28 is provided for applying an adhesive coating to the strip 10 after the resinous coatings have been applied.

Whether the strip 10 is composed of glass fiber cloth, or not, it is preferably provided with thin sizing coating of a synthetic material, such as polyvinyl alcohol, to improve flexibility of the fibers.

Though the sizing coating 29 and other coatings 30 and 31 of resin are applied to both sides of the surface of the strip 10, as shown in FIG. 2, the sizing 29 and resin coatings 30 and 31 impregnate the fabric and covers the fibers 32. The resins are preferably synthetic and composed of alkyd phenolic or epoxy resins. After each coating is applied the strip passes through the drying tower 22 and over the rolls 24 at a speed of from 2 to 9 feet per minute. The drying tower 22 is a housing in which means for heating are provided to dry the solvent out of the resinous coating. More than one coating of the resin is preferably applied to avoid the presence of pin holes in the outer surface of the strip which may be present after only a single coating of resin.

For epoxy as well as phenolic resins a temperature range of 135° to 165° C. and preferably about 150° C., is maintained within the tower to substantially fully cure the applied resinous coatings on the strip 10 in a period of time of the order of 10 to 30 minutes. The temperature within the drying tower 22 is closely controlled so that the successive coatings of resin, which completely saturate and impregnate the fibrous carrier web or backing, are fully cured before the coated strip 10 leaves the tower.

The carrier web or strip 10 has an original thickness of from 1 to 10 mils depending upon the type of material used. After the resinous coatings, including for example, a thin polyvinyl alcohol precoating, have been applied and cured the thickness will be from 3½ to 15 mils.

After the final coating of resin is applied a coating 34 of adhesive is applied to one side of the strip 10 by passing it over a roller 26 in a tank 28 whereby one side of the strip dips into a bath of liquid adhesive 34. To control the applied thickness (about ½ mil) of the coating of adhesive the strip 10 passes over a wiping bar 36 above the adhesive bath 34. The adhesive 34 comprises synthetic adhesive saturated resin such as an epoxy resin, a polyester resin or a phenolic-nitrile rubber composition. Such adhesives capable of bonding to metal are well known. The strip coated with the adhesive is partly cured by passing it through the drying tower 22 and from where it passes out of the tower over guide rollers 38 and 40.

Concurrently with the application of the coatings of the resin and adhesive, metallic foil 14 is discharged from a coil 42 of foil and an adhesive coating 43 is applied to one side of the foil by an adhesive applicator 44 which is disposed between guide rollers 46 and 48. The adhesive coating 43 preferably has a composition similar to the adhesive 34 on the strip 10. Both adhesives 34 and 43 are composed of a synthetic resin such for example as a phenolic-nitrile rubber copolymer.

As the strip of foil 14 continues to move it passes over heating means such as infrared lamps 50 whereby the adhesive 43 is dried and partially cured. For that purpose an exhaust hood 52 is provided over the area of the infrared lamps 50. The strip 14 of metal foil then passes over a heated metal roll 54 which is heated to a temperature of approximately 200° C. for the purpose of further drying the adhesive 43 on the foil by evaporating more solvent. The metal roll 54 operates in conjunction with an elastomer roll 56 for pressing the adhesive coated metal strip 14 to the adhesive coated strip 10 under pressure.

An excellent adhesive bond occurs when the strips 10 and 14 move between the rolls 54 and 56 with the metal foil strip 14 uppermost and the base strip 10 lowermost and adjacent to the lower roll 56. A pressure having a range of from 15 to 250 pounds per square inch is applied to the strips 10 and 14 for joining their adhesive layers 34 and 43 together into a single foil clad laminate which is additionally heated by moving in contact with a heating shoe 60 at a temperature of approximately 200° C. for finally fully curing and setting the adhesive layers. Thereafter the composite foil clad laminate strip 58 is accumulated on a coil 62. The foil clad laminate is flexible and possesses excellent bond strength between the foil and the fibrous backing.

The composite foil clad laminate 58 is subsequently provided with a printed circuit by removing or etching away by known techniques unnecessary portions of the metal strip 14 leaving circuit portions 66 of the foil as shown in FIG. 4.

A plurality of composite foil clad laminates 58 in printed circuit form may be bonded together to provide multilayer circuitry as shown in FIG. 5. For that purpose a plurality of strips 10 are stacked and pressed together. The adhesive layer 43 preferably has extra thickness to enable the circuit portions 66 to be embedded when the layers are pressed together. For that purpose an adhesive layer 67 may be applied to the side of the strip 10 opposite the adhesive 43.

The metallic foil 14 may be composed of any metals having suitable properties of electrical conductivity. Metals having good electrical conductivity include copper, silver, aluminum and base alloys thereof. Metals having higher resistance include stainless steel, Kovar and other metals or alloys. These foils are from about 0.0005 to 0.003 mil in thickness.

The metals having high coefficients of resistance are used for the resistance portions of a circuit.

The following examples are illustrative of the present invention.

EXAMPLE I (A) Flexible foil clad laminates suitable for making printed circuits are produced by using a substrate of parchment paper having a 2 mil thickness. Using apparatus as shown in FIG. 1, the paper is impregnated with two coatings of a phenolic alkyd resin corresponding to Example III of U.S. Pat. No. 2,977,333. After curing the applied coatings at about 150° C., the total thickness was 3½ mils, the coated parchment being pore free. A layer of phenolic-nitrile rubber adhesive is applied to the resin coated paper substrate as well as to a one ounce foil (1.4 mils thick) of copper, which applied adhesive layers are partly cured by heating, and then they are bonded together by hot rolling the foil and paper together at pressures of 200 p.s.i. at temperatures of about 200° C. after which the laminate is fully cured by heating at about 150° C. for several minutes. The resulting foil-paper laminate is extremely flexible so that it can be rolled into a small diameter cylinder without any physical failure, has good thermal endurance up to 100° C., and exhibits excellent metal adherence when tested at 8 pounds peel strength at a 180° angle.

(B) Following the procedure (A) of this example, 5 mil thick kraft paper is employed instead of the parchment paper with equally satisfactory results.

The phenolic nitrile rubber adhesive used in the example comprised a 20% solution in methyl ethyl ketone of a mixture of equal parts by weight of acrylonitrile-rubber and B-stage phenolic resin. The proportions of the nitrile rubber can be varied from 25% to 75% and the phenolic resin constitutes the balance. The phenolic resin comprises the reaction product of a phenol such as cresol and formaldehyde in substantially equimolecular portions.

EXAMPLE II

Another flexible foil clad laminate suitable for use as a printed circuit is prepared from 107 glass cloth of 1.7 mils thickness, coated first with a 1.2 mil thick coating of polyvinyl alcohol, and then with two coatings of phenolic saturated alkyd varnish to provide a relatively smooth pore-free coated substrate having a total thickness of 3.5 mils. Thereafter a coating of the phenolic nitrile adhesive, as in Example I, is applied to the coated substrate and to a foil of copper of 1.4 mil thickness, the adhesive is partly cured, and they are bonded together by hot rolling and substantially fully cured at about 150° C. The laminate showed high flexibility, and the adherence of the copper foil was excellent averaging over 8 pounds on the peel test.

EXAMPLE III

In a manner similar to Example II a 107 glass cloth of 1.7 mil thickness is provided with a coating of polyvinyl alcohol as a sizing and then coated by two dips in a flexible epoxy resin. The resulting coated glass cloth is about 5.0 mils thick. A layer of phenolic nitrile rubber adhesive is then applied to the resin coated glass cloth substrate, and also to a one ounce foil (1.4 mils thick) of copper. The copper foil was hot roll bonded to the one adhesive clad side of the glass cloth substrate. The other side of the glass cloth was then coated with the phenolic-nitrile rubber adhesive, partly cured, and a second foil of 1.4 mil thick copper was coated with a phenolic nitrile rubber adhesive partly cured, and the foil and glass cloth were bonded together under heat and pressure to produce a flexible laminate having copper foil on both surfaces.

The epoxy resin used in this Example III is prepared by esterifying 60 parts by weight of the epichlorhydrin bisphenol resin having a melting point of about 100° C. with 40 parts by weight of linseed oil fatty acids, and admixing the resulting esterified reaction product with butylated melamine aldehyde resinous reaction product, the mixture being in solution in a volatile organic solvent such as methyl ethyl ketone or butyl Carbitol to produce a 20% resin solids solution. Various other fatty acids particularly unsaturated fatty acids can be substituted in whole or in part for the linseed oil fatty acids and the amount varied, as for example from 20% to 50% by weight. The butylated melamine resin can be prepared as in Example 9 of Pat. 2,197,357. The melamine resin function as a curing agent for the epoxy resin-fatty acid reaction product. Other curing agents such as amines may be employed.

EXAMPLE IV

A sheet of 108 glass cloth of 2 mils thickness is coated with a sizing of polyvinyl alcohol then coated with B-185 phenolic alkyd resin corresponding to Example III of U.S. Pat. No. 2,977,333 to produce a base having a total thickness of 5 mils. As in Example I, a phenolic nitrile adhesive is applied to the coated substrate. Separate portions of the resulting imperforate coated glass cloth are then provided with a copper layer composed of copper foil having a thickness of 1.7 mils, 2.8 mils, and 4.2 mils, respectively, by applying a coating of partly cured adhesive to the foil and hot bonding it to the glass cloth. Electro-deposited copper layers of thicknesses of 1.7, 2.8 and 4.2 mils, respectively, also have been plated on the glass cloth. Printed circuits prepared from each of these, displayed good flexibility and adherence properties.

The adherence or bond test employed herein involved pulling or peeling copper strips from the coated base by applying a load to a peeled 1 inch wide portion of the copper foil at 180° to the substrate and the load is increased until the foil peels slowly and steadily. The last load is the peel strength for the laminate.

Each of the foil clad laminates of Examples I to IV were converted into printed circuit members by, applying a photoresist pattern to the foil surface in a conventional manner, etching away the copper exposed through the pattern, and then removing the resist thereby exposing the copper printed circuit pattern. The resulting printed circuit members can be employed in electrical apparatus, or they may be superimposed with a resinous adhesive between successive layers and the assembly consolidated under heat and pressure into a unitary member providing a multi-layer printed circuit.

The resulting printed circuit sheet had electrical components attached thereto which were soldered to the copper foil portion on the sheet, and good solderability was exhibited. The copper foil portions were not loosened or otherwise adversely affected by the soldering operation.

After the desired circuits are obtained by a conventional method such as etching away the metal foil, a laminated circuit board with 10 layers having a total thickness of 1/16 inch may be provided by the application of a pressure of from 15 to 250 p.s.i. at a molding temperature varying from 150 to 175° C. for a time from 5 minutes to 1 hour depending upon the degree of curing of the resins.

Accordingly, the method of the present invention provides a multi-layered printed circuit which overcomes the disadvantages of prior printed circuits such as dimensional instability and poor solderability. These advantages are obtained by fully curing the resins after being applied to the carrier web or base such as fiberglass. Moreover by applying a sizing coat to fiberglass the subsequent coatings of resin adhere better to the fiberglass and thereby provide a smoother finish to which the metal foil is readily bonded.

What is claimed is:

1. A highly flexible foil clad laminate suitable for producing a printed circuit having improved dimensional stability and solderability comprising a single layer of flexible fibrous material of not over 10 mils thickness at least one coating of a fully cured synthetic resin applied to the fibrous material to produce a smooth, non-porous substrate, a layer of resinous adhesive applied to at least one side of the resinous coating of the substrate, at least one of the coating and adhesive containing a major portion of resins selected from the group consisting of saturated polyester, epoxy resin, and phenolic nitrile rubber and being devoid of substantial amounts of unsaturated polyesters and monomers, and a metal foil bonded by the adhesive to the fibrous material.

2. The device of claim 1 in which the flexible fibrous material is composed of glass fibers, the synthetic resinous coating is an epoxy resin, and the resinous adhesive is composed of a phenolic-nitrile rubber composition.

3. The device of claim 1 in which the metal foil is composed of copper sheet.

4. The device of claim 1 in which a sizing coating composed essentially of polyvinyl alcohol is applied before said first applied coating of fully cured synthetic resin.

5. The device of claim 4 in which the coating is an alkyd phenolic resin.

References Cited

UNITED STATES PATENTS

| | | | |
|---|---|---|---|
| 2,692,190 | 10/1954 | Pritkin | 156—3 |
| 2,695,351 | 11/1954 | Beck | 29—626 |
| 3,340,606 | 9/1967 | Anderson et al. | 174—68.5 |
| 3,378,434 | 4/1968 | Harrington | 161—403 |

WILLIAM J. VAN BALEN, Primary Examiner

U.S. Cl. X.R.

29—625; 156—3, 298, 310; 161—93, 185, 218, 413; 174—68.5